United States Patent
You et al.

(10) Patent No.: US 7,033,960 B1
(45) Date of Patent: Apr. 25, 2006

(54) MULTI-CHAMBER DEPOSITION OF SILICON OXYNITRIDE FILM FOR PATTERNING

(75) Inventors: Lu You, San Jose, CA (US); Richard Huang, Cupertino, CA (US); Pei-Yuan Gao, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/918,378

(22) Filed: Aug. 16, 2004

(51) Int. Cl.
*H01L 21/31* (2006.01)
*H01L 21/469* (2006.01)

(52) U.S. Cl. .................. 438/786; 438/717; 438/950
(58) Field of Classification Search ............... 438/661, 438/717, 770, 786, 942, 950, 954
See application file for complete search history.

(56) References Cited

U.S. PATENT DOCUMENTS

| | | | |
|---|---|---|---|
| 6,825,114 B1 * | 11/2004 | Fisher et al. ................ | 438/661 |
| 6,841,341 B1 * | 1/2005 | Fairbairn et al. ........... | 430/323 |
| 6,884,733 B1 * | 4/2005 | Dakshina-Murthy et al. .... | 438/717 |

OTHER PUBLICATIONS

Gao, Pei-Yuan, et al. "Hardmask Employing Multiple Layers Of Silicon Oxynitride" pp. 1-6 specification, pp. 1-3 formal drawings.

* cited by examiner

*Primary Examiner*—Phuc T. Dang

(57) ABSTRACT

Pinholes in a silicon oxynitride film are reduced by PECVD deposition of a plurality of silicon oxynitride sub-layers in a PECVD apparatus containing multiple chambers. Embodiments include forming a layer of amorphous carbon over a conductive layer, such as doped polycrystalline silicon, on a substrate, transferring the substrate to a multi-chamber PECVD tool and depositing 2 to 7, e.g., 5, sub-layers of dense silicon oxynitride at a total thickness of 300 to 700 Å.

13 Claims, 3 Drawing Sheets

MULTI-CHAMBER DEPOSITION OF SILICON OXYNITRIDE FILM FOR PATTERNING

FIELD OF THE INVENTION

The present invention relates to a method of fabricating semiconductor devices exhibiting high reliability, highly accurate device features and superior repeatability. The present invention has particular applicability in fabricating high density, multi-level semiconductor devices with feature dimensions in the deep sub-micron regime.

BACKGROUND OF THE INVENTION

As the drive for the continued miniaturization proceeds apace, various issues arise imposing increasing demands for methodology enabling the fabrication of semiconductor devices having accurately dimensioned microminiaturized features. As the gate width for transistors decreases to about 400 Å and under, various dimensional accuracy issues arise.

Semiconductor device features, such as a gate width are typically patterned employing an overlying structure comprising a layer functioning as an anti-reflective coating (ARC) during photoresist patterning and a layer functioning as a hardmask during patterning of an underlying patternable layer. For example, adverting to FIG. 1A, an intermediate structure employed to form a gate electrode is illustrated and comprises a semiconductor substrate 10, isolation regions 12 defining an active area, a conformal gate insulating layer 14, such as silicon oxide, and a patternable gate conductive layer 16, such as polysilicon, formed over the gate insulating layer 14. A bi-layer ARC/hardmask structure is formed over the gate conductive layer 16 and comprises ARC 20, such as silicon oxynitride typically deposited by plasma enhanced chemical vapor deposition (PECVD) and hardmask 18, such as amorphous carbon which may be doped with nitrogen to improve its etch selectively with respect to the underlying polysilicon 16. A photomask 12 is formed on the silicon oxynitride layer 20 and is used to pattern the silicon oxynitride layer 20 which, in turn, is employed as a hardmask to pattern amorphous carbon layer 18 which, in turn, is used as a hardmask to pattern polysilicon layer 16 to form a gate electrode.

As critical dimensions of semiconductor devices shrink, such as the gate width, it is necessary to decrease the thickness of the overlying ARC/hardmask structure, such as the bi-layer silicon oxynitride ARC 20/amorphous carbon hardmask layer 18 illustrated in FIG. 1A. However, as the gate width is reduced to 400 A and less, the required reduction in thickness of the overlying ARC/hardmask generates various problems. For example, as the silicon oxynitride ARC is decreased in thickness, "pinholes" occur. Such pinholes are believed to be generated by outgassing from underlying layers during deposition of the PECVD material. For example, when silicon oxynitride is deposited by PECVD over an amorphous carbon layer, residual hydrogen from the amorphous carbon layer is emitted, thereby causing localized non-uniformities in the PECVD silicon oxynitride layer. During PECVD deposition of silicon oxynitride, reduced deposition occurs proximate the non-uniformities, thereby generating pinholes that extend partly or entirely through the silicon oxynitride layer from locations of the non-uniformities.

The occurrence of pinholes result in at least two serious problems. One problem generated by pinholes is photoresist poisoning. Adverting to FIG. 1B, pinhole 24 enables diffusion of nitrogen doping from the amorphous carbon layer 18 into an overlying photoresist layer 26 forming a region of poisoned photoresist 28. Poisoned photoresist exhibits reduced response to conventional photoresist development chemistries and, consequently, remain after development causing undesired patterning of underlying layers during subsequent processing.

Another problem stemming from pinholes is premature etching of the amorphous carbon layer during reworking of the photoresist. During typical processing, photoresist layers are applied over the bi-layer ARC/hardmask, patterned and removed several times. Adverting to FIG. 1C during removal of the photoresist, the chemistry used to strip the photoresist may pass through a pinhole and contact the underlying amorphous carbon layer, causing etching as in region 30 in the amorphous carbon layer 18. This results in the formation of anomalous patterns in the amorphous carbon layer that may be transferred to underlying layers during subsequent processing. Such etching has been found to occur even with pinholes that did not extend completely through the silicon oxynitride layer 26, a phenomenon known as "punch through."

Accordingly, there exists a need for methodology enabling fabrication of semiconductor devices having accurately patterned microminiaturized features. There exists a particular need for methodology enabling fabrication of accurately dimensioned gate electrodes having a width of 400 Å or less.

SUMMARY OF THE INVENTION

An advantage of the present invention is a method of manufacturing a semiconductor device having improved reliability and accurately dimensioned device features.

Another advantage of the present invention is a method of manufacturing a semiconductor device comprising transistors with accurately dimensioned sub-micron gate electrodes.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method manufacturing a semiconductor device, the method comprising: providing a substrate with a patternable layer thereover; forming an amorphous carbon layer over the patternable layer; transferring the substrate to a multi-chamber plasma enhanced chemical vapor deposition (PECVD) apparatus; and sequentially depositing a plurality of silicon oxynitride sub-layers to form a composite silicon oxynitride layer over the amorphous carbon layer.

Embodiments of the present invention include forming a photoresist mask over the composite silicon oxynitride layer and patterning the underlying patternable layer, such as doped polycrystalline silicon, to form a gate electrode. In accordance with embodiments of the present invention, each silicon oxynitride sub-layer is deposited in an apparatus comprising plural deposition chambers and under conditions such that the density of each silicon nitride sub-layer is at least 2.45 g/cc. Embodiments of the present invention comprise depositing from 2 to 7, e.g., 5, silicon oxynitride sub-layers to form a composite silicon oxynitride layer having a thickness of 300 Å to 700 Å.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 3, similar features or elements are denoted by similar reference characters.

DETAILED DESCRIPTION OF THE INVENTION

Figure 1A:
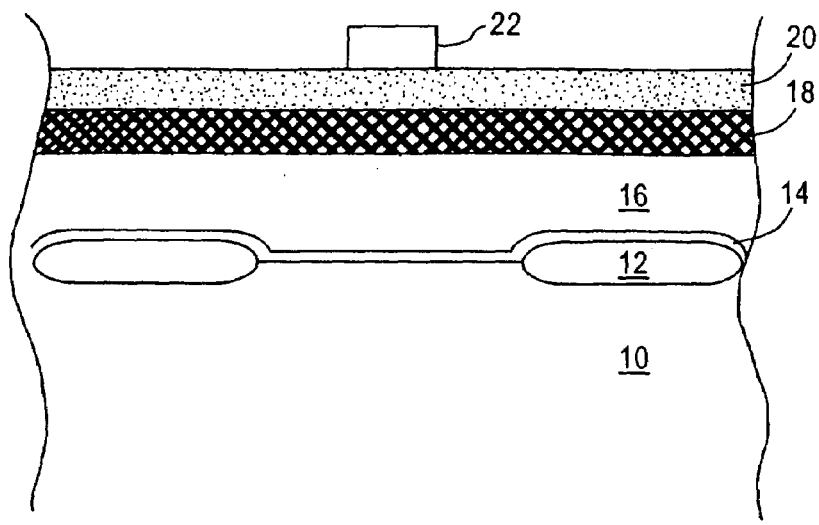
FIGS. 1A through 1C schematically illustrate pinhole problem addressed and solved by the present invention.
Figure 1B:
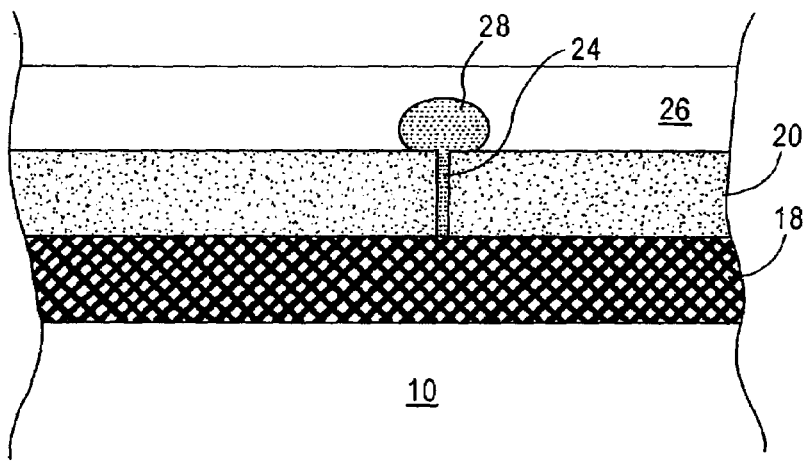
Figure 1C:
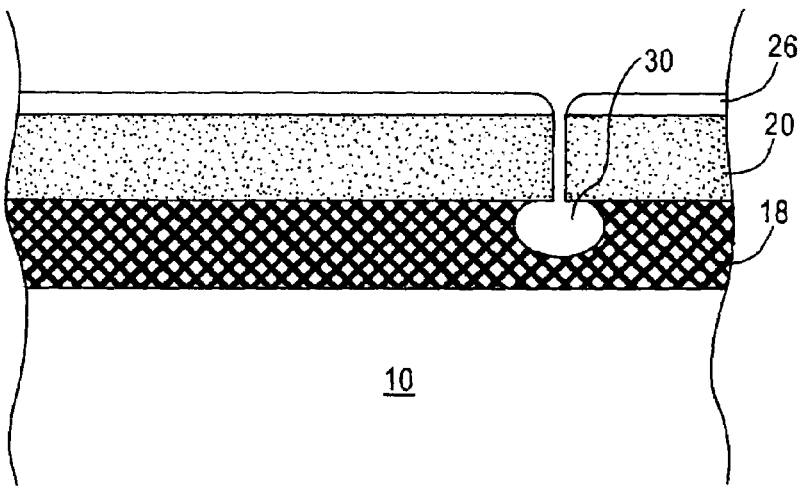

As semiconductor device feature sizes shrink into the deep-submicron regime, various dimensional accuracy issues arise impacting device reliability. As gate widths plummet to 400 Å and under, it is necessary to reduce the thickness of the ARC/hardmask employed for patterning the gate electrodes. However, such reduction in the ARC thickness generates pinholes causing photoresist poisoning and hardmask etching, thereby adversely impacting the critical dimension.

These problems were addressed in copending application Ser. No. 10/256,368 filed on Sep. 27, 2002 now U.S. Pat. No. 6,803,313, by forming a plurality of silicon oxynitride layers over the amorphous carbon layer. This technique was said to reduce the pinhole density at the surface of the uppermost ARC sub-layer. By providing multiple ARC sub-layers the chance of a pinhole extending from the bottom layer through a line with a pinhole in the top layer was remote. Suitable ARC materials include silicon oxynitride, silicon carbide, silicon oxide, SiCH and SiCOH. The ARC sub-layers may be formed by PECVD.

The present invention constitutes an improvement over the methodology disclosed in U.S. Pat. No. 6,803,313 by forming multiple ARC sub-layers in a PECVD tool having multiple deposition chambers, such as a Novellus® CVD tool manufactured by Applied Materials, Inc. of Santa Clara, Calif. In accordance with the present invention, ARC sub-layers, such as sub-layers of silicon oxynitride, are deposited under controlled deposition conditions to yield individual sub-layers of silicon oxynitride having an increased density vis-à-via silicon oxynitride layers formed by prior practices, thereby further reducing pinhole density. For example, in accordance with embodiments of the present invention, deposition conditions are controlled to achieve a low deposition rate such that the as deposited silicon oxynitride sub-layers each have a density no less than 2.45 g/cc; whereas, conventional deposition techniques result in silicon oxynitride layers having a density of no greater than 2.35 g/cc.

In accordance with an embodiment of the present invention, a plurality of silicon oxynitride sub-layers are deposited, such as 2 to 7 e.g., 5. The strategic deposition of a plurality of dense silicon oxynitride layers is a tool having multiple deposition chambers not only reduces the adverse impact of pinholes by minimizing the occurrence of a pinhole which extends from the bottom layer through the upper most layer, but also reduces the occurrence of pinholes by virtue of the increased density.

Embodiments of the present invention include PECVD in a plurality of deposition chambers thereby providing extremely uniform sub-layers of PECVD thereby further decreasing the possibility of generating pinholes between layers. The use of a multiple chamber deposition tool in accordance with embodiments of the present invention further increases repeatability and, hence, wafer-to-wafer uniformity in accurately patterning features, such as gate electrodes.

During PECVD deposition in accordance with embodiments of the present invention, the composite silicon oxynitride film is deposited under conditions such that it exhibits an extinction coefficient (k) ranging from 0.23 to 0.30 and a refractive index (n) of 1.84 to 1.92, thereby enabling excellent performance as an anti-reflective material. Embodiments of the present invention further include controlling deposition conditions such that each sub-layer is deposited at an advantageously reduced deposition rate, such as no greater than 1,000 Å/minute by controlling the flow rate and pressure, such that the mean free path during deposition is increased, thereby providing superior quality layers having reduced pinholes, higher density, higher thickness uniformity and excellent step coverage.

Embodiments of the present invention comprise depositing the composite silicon oxynitride ARC in a tool having plural deposition chambers, each sub-layer deposited in a separate deposition chamber at a nitrogen ($N_2$) flow rate of 3.6 to 4.4, e.g., 4 standard liter per minute (slm); a silane ($SiH_4$) flow rate of 0.13 to 0.17, e.g., 0.15 slm; a nitrous oxide ($N_2$) flow rate of 0.45 to 0.55, e.g., 0.5 slm; a HF power of 0.36 to 0.44, e.g., 0.4 KW, a temperature of 360° C. to 450° C., e.g., 400° C., and a pressure of 2.3 to 2.9, e.g., 2.64 Torr. A typical deposition time for each sub-layer is about 1.8 to 2.2, e.g., 2, seconds. Each sub-layer can be deposited at a thickness of 60 Å to 250 Å. The composite silicon oxynitride layer typically has a thickness of 300 Å to 700 Å.

Figure 2:
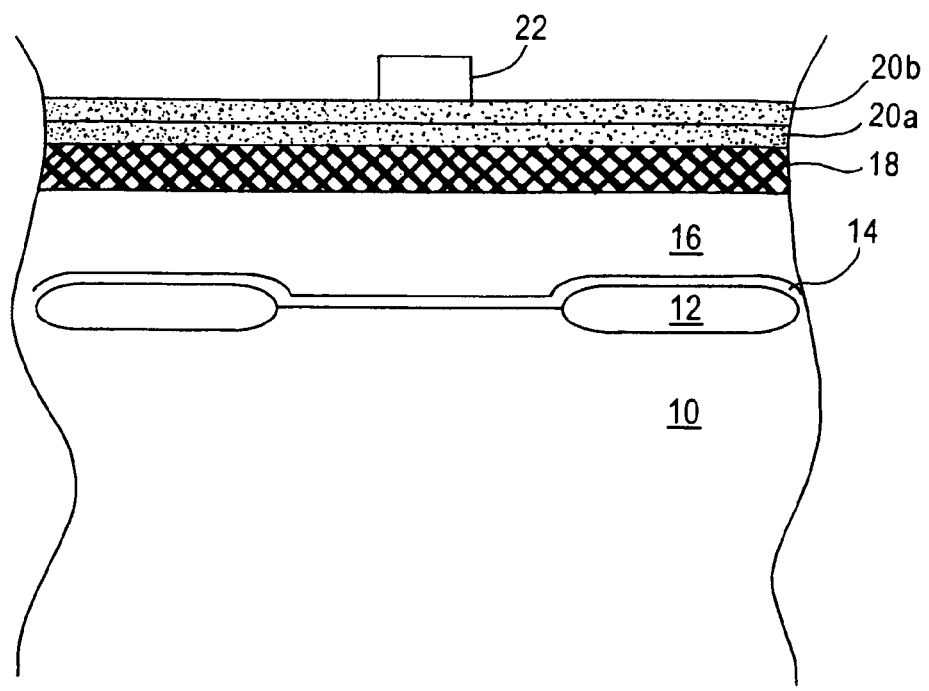
FIGS. 2 and 3 schematically illustrate an embodiment of the present invention.

An embodiment of the present invention is schematically illustrated in FIG. 2 which depicts an intermediate structure similar to that illustrated in FIG. 1A in that it comprises a semiconductor substrate 10, isolation regions 12, gate insulating layer 14, polysilicon gate conductive layer 16 and a composite ARC/hardmask structure comprising amorphous carbon layer 18 and overlying ARC photoresist mask 22. However, in accordance with the present invention, the ARC portion of the composite ARC/hardmask structure comprises a plurality of layers of silicon oxynitride, e.g., sub-layers 20a and 20b. Each sub-layer is deposited in a separate deposition chamber of a multi-chamber CVD tool under conditions that ensure high density and high thickness uniformity, thereby further minimizing pinholes.

Embodiments of the present invention include heat soaking, as at a temperature of 400° C. for 30 seconds before initiating deposition of the silicon oxynitride sub-layers. Etching may be conducted at an etch rate of 50 to 80 A°/sec.

Figure 3:
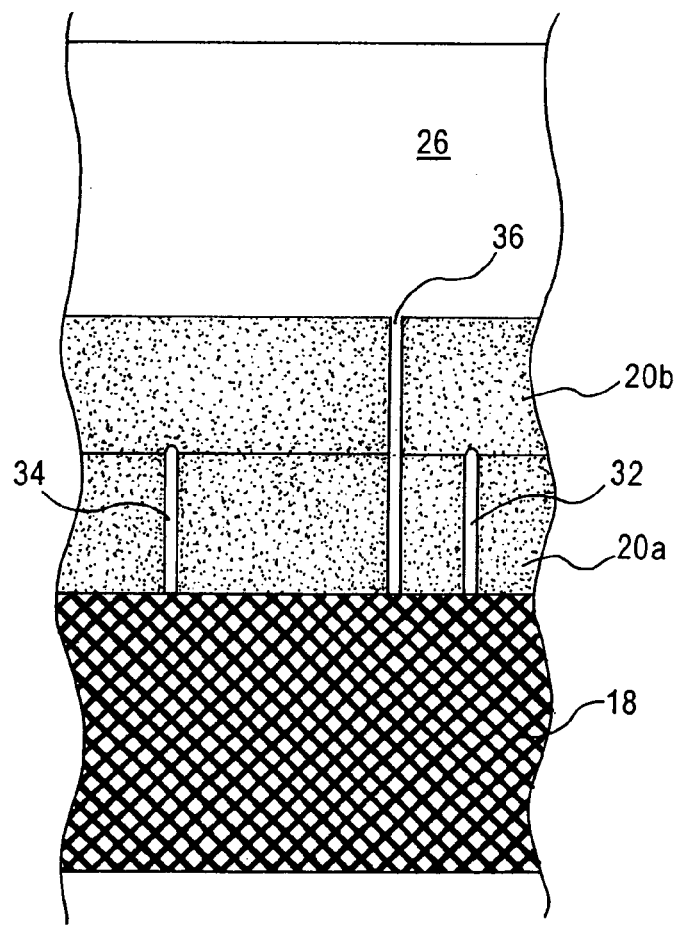

Adverting to FIG. 3, the advantageous impact of multiple sub-layers of a composite silicon oxynitride layer on pinhole growth is illustrated. Pinholes illustrated by reference characters 32, 34 and 36, form by depositing first silicon oxynitride sub-layer 20a and extend through that particular layer. However, by depositing a separate sub-layer of silicon oxynitride 20b on sub-layer 20a, pinholes 32 and 34 in sub-layer 20a are closed. In the event a pinhole in sub-layer 20a happens to be aligned with a pinhole in sub-layer 20b, that could be closed by forming an additional sub-layer thereon. Embodiments of the present invention include forming a 5 to 7 sub-layers of silicon oxynitride, thereby ensuring that pinholes do not extend completely through the composite silicon oxynitride layer. By employing multiple chamber deposition, each sub-layer may be deposited at a high density and with extremely high thickness uniformity, thereby enabling plural layers to be deposited, such as 5 to 7 layers, with extreme accuracy and reduced pinholes.

Figure 4:
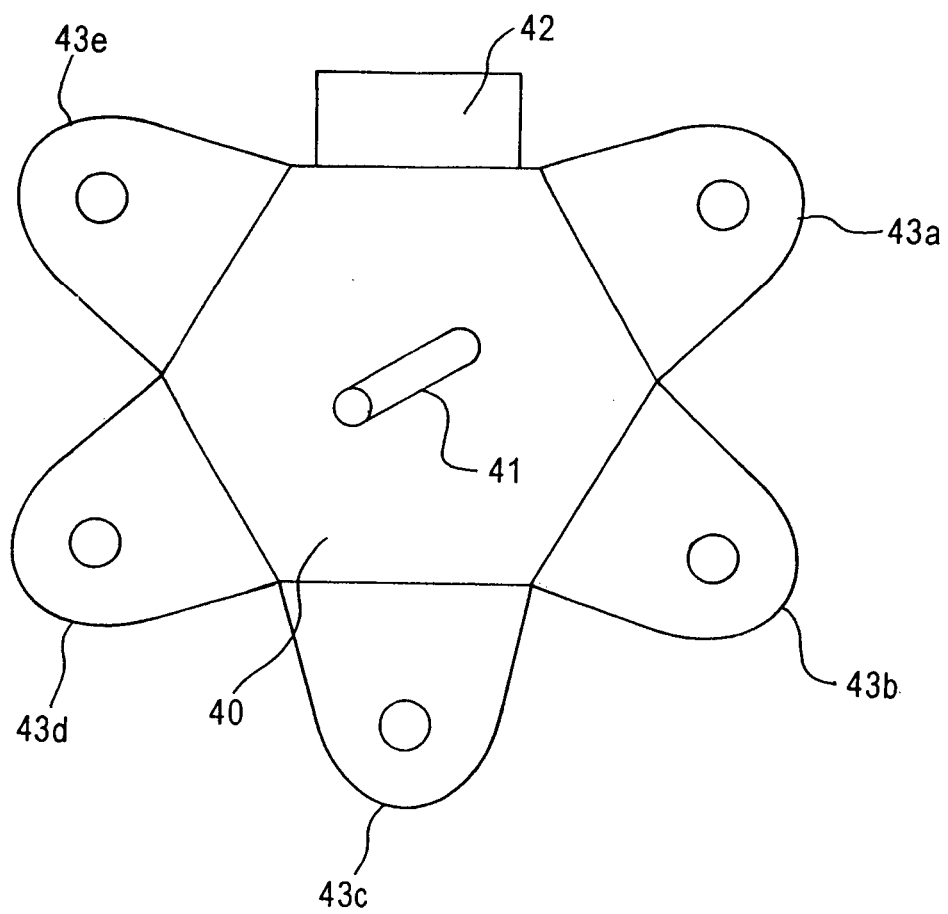
FIG. 4 schematically illustrates an apparatus for use in practicing embodiments of the present invention.

FIG. 4 schematically illustrates a multi-chamber PECVD deposition tool comprising a flame 40, a robotic arm 41, a loading and unloading station 42 and multiple deposition chambers 43a–43e. The use of a multiple chamber deposition PECVD tool and controlling deposition conditions enable the deposition of a plurality, e.g., 5, sub-layers of silicon oxynitride having a high density and high thickness uniformity thereby dramatically reducing the adverse impact of pinholes and photoresist poisoning on patterning accuracy.

The present invention provides methodology enabling the fabrication of semiconductor devices having transistors with accurately dimension submicron features, such as gate electrodes having a width no greater than 400 Å. The present invention achieves that objective by forming an ARC/hardmask structure comprising a composite ARC of high density sub-layers with uniform thickness deposited in a PECVD tool having multiple chambers under controlled deposition conditions.

The present invention enjoys industrial applicability in fabricating various types of semiconductor devices. The present invention enjoys particular industrial applicability in fabricating highly integrated semiconductor devices exhibiting increased circuit speed and submicron dimensions, e.g., with a design rule of about 0.12 micron and under, with high reliability.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and environments and is capable of changes and modifications within the scope of the inventive concept as expressed herein.

What is claimed is:

1. A method of manufacturing a semiconductor device, the method comprising:
   providing a substrate with a patternable layer thereover;
   forming an amorphous carbon layer over the patttemable layer;
   transferring the substrate to a multi-chamber plasma enhanced chemical vapor deposition (PECVD) apparatus; and
   sequentially depositing a plurality of silicon oxynitride sub-layers to form a composite silicon oxynitride layer over the amorphous carbon layer.

2. The method according to claim 1, further comprising:
   forming a photoresist mask over the composite silicon oxynitride layer; and
   patterning the patternable layer.

3. The method according to claim 2, wherein the patternable layer comprises a polysilicon layer.

4. The method according to claim 3, comprising patterning the polysilicon layer to form a gate electrode.

5. The method according to claim 2, comprising depositing each silicon oxynitride sub-layer at a deposition rate of 1000 Å or less.

6. The method according to claim 2, comprising depositing each silicon oxynitride sub-layer such that it exhibits a density of at least 2.45 g/cc.

7. The method according to claim 2, comprising depositing each silicon oxynitride layer at:
   a nitrogen ($N_2$) flow rate of 3.6 to 4.4 slm;
   a silane ($SiH_4$) flow rate of 0.13 to 0.17 slm;
   a nitrous oxide ($N_2O$) flow rate of 0.45 to 0.55 slm;
   an HF power of 0.36 to 0.44 KW;
   a temperature of 360° C. to 440° C.; and
   a pressure of 2.3 to 2.9 Torr.

8. The method according to claim 7, comprising depositing each silicon oxynitride sub-layer for 1.8 to 2.2 seconds.

9. The method according to claim 2, comprising depositing each silicon oxynitride sub-layer at a thickness of 16 Å to 140 Å.

10. The method according to claim 2, comprising depositing the composite silicon oxynitride layer at a thickness of 300 Å to 700 Å.

11. The method according to claim 8, comprising depositing 2 to 7 silicon oxynitride sub-layers.

12. The method according to claim 9, comprising depositing 5 silicon oxynitride sub-layers.

13. The method according to claim 2, comprising depositing the silicon oxynitride composite layer such that it has an extinction coefficient (k) of 0.23 to 0.30 and an index of refraction (n) of 1.84 to 1.97.

* * * * *